United States Patent
Ryu et al.

(10) Patent No.: US 7,030,508 B2
(45) Date of Patent: Apr. 18, 2006

(54) SUBSTRATE FOR SEMICONDUCTOR PACKAGE AND WIRE BONDING METHOD USING THEREOF

(75) Inventors: Dong Su Ryu, Seongnam (KR); Doo Hyun Park, Seoul (KR); Ho Seok Kim, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/884,082

(22) Filed: Jul. 1, 2004

(65) Prior Publication Data

US 2005/0001299 A1  Jan. 6, 2005

(30) Foreign Application Priority Data

Jul. 4, 2003  (KR) ...................... 10-2003-0045304

(51) Int. Cl.
*H01L 23/544* (2006.01)
(52) U.S. Cl. ....................... 257/797; 257/678; 257/688; 257/692; 257/774; 257/775; 257/776; 438/975
(58) Field of Classification Search ................ 257/678, 257/797, 688, 692, 774–776, E23.179; 438/975
See application file for complete search history.

(56) References Cited

U.S. PATENT DOCUMENTS

| | | | | |
|---|---|---|---|---|
| 5,627,408 A | * | 5/1997 | Kusumi | 257/784 |
| 5,760,484 A | * | 6/1998 | Lee et al. | 257/797 |
| 5,895,967 A | * | 4/1999 | Stearns et al. | 257/691 |
| 6,002,182 A | * | 12/1999 | Madurawe | 257/797 |
| 6,420,790 B1 | * | 7/2002 | Koizumi | 257/787 |
| 6,441,497 B1 | * | 8/2002 | Han | 257/777 |
| 6,600,217 B1 | * | 7/2003 | Onodera et al. | 257/667 |
| 6,818,986 B1 | * | 11/2004 | Ikenaga et al. | 257/734 |
| 2001/0021548 A1 | * | 9/2001 | Yokota | 438/200 |
| 2002/0140107 A1 | * | 10/2002 | Kato et al. | 257/777 |
| 2003/0110624 A1 | * | 6/2003 | Rumsey et al. | 29/840 |
| 2003/0205791 A1 | * | 11/2003 | Yamaguchi | 257/676 |

* cited by examiner

*Primary Examiner*—Kenneth Parker
*Assistant Examiner*—Chris C. Chu
(74) *Attorney, Agent, or Firm*—Gunnison, McKay & Hodgson, L.L.P.; Serge J. Hodgson (57) ABSTRACT

Disclosed is a substrate for semiconductor package and a wire bonding method using thereof. The substrate is provided with at least one reference mark on its surface to check a loading position and a shift state of a solder mask. The reference mark is composed of a combination of a reference pattern and a solder mask opening and is positioned in any location on an outer peripheral edge of a die attachment region. The reference mark may take various shapes. A method for checking a solder mask shift using the reference mark includes comparing a design value of the reference pattern and the solder mask opening with the reference pattern and the solder mask opening, which are formed in an actual material. After the solder mask shift is calculated, a wire bonding coordinate is newly constructed in consideration of the solder mask shift. This minimizes the wire bonding error.

23 Claims, 10 Drawing Sheets

Design value    Actual material

FIG. 2A

Design value    Actual material

| UNIT POSITION | SOLDER MASK SHIFT | |
|---|---|---|
| | X-AXIS | Y-AXIS |
| POSITION 1 | 0 | 0 |
| POSITION 2 | +70um | 0 |
| POSITION 3 | 0 | +70um |
| POSITION 4 | +70um | +70um |
| POSITION 5 | -70um | -70um |
| POSITION 6 | 0 | 0 |

FIG. 3C

Design value          Actual material

SUBSTRATE FOR SEMICONDUCTOR PACKAGE AND WIRE BONDING METHOD USING THEREOF

BACKGROUND OF THE INVENTION

1. Field of the Invention

The present invention relates to a substrate for semiconductor package and a wire bonding method using thereof.

2. Description of the Related Art

In general, "wire bonding" refers to a process wherein a semiconductor die, which is separately sawn from a wafer, is attached on a substrate using adhesive, and a bond pad, which is formed on the semiconductor die, is electrically connected to electrically conductive patterns, which are formed on the substrate.

The wire bonding is performed using a wire bonder, which comprises a camera for recognizing the coordinates of the substrate and the semiconductor die; a PRS (pattern recognition system) for processing images recognized by the camera and calculating a changed wire bonding coordinate; and, a capillary for performing bonding in accordance with the changed wire bonding coordinate. The PRS compares pre-stored reference coordinates with actual coordinates, which are photographed by the camera, so that wires can be bonded at the changed coordinate. Specifically, the PRS makes it possible to determine, before wire bonding, whether the coordinates of the substrate and the semiconductor die correspond to the pre-stored coordinates, as well as how much the coordinates should be modified, if they do not correspond.

Meanwhile, the substrate is provided with a number of electrically conductive patterns having bond fingers, a power ring, a ground ring, and the like. The bond fingers, the power ring, and the ground ring are not coated with a solder mask and are entirely opened for easy wire bonding. In addition, the substrate is additionally provided with an entirely-exposed fiducial mark so that the PRS of the wire bonder can determine whether the substrate is positioned in any location, where it is connected with the electrically conductive patterns, the power ring, or the ground ring or not. Furthermore, certain regions of an outer peripheral edge of the substrate are not coated with the solder mask, including, as mentioned, the bond fingers, the power ring, the ground ring, and the fiducial mark, in consideration of the tolerance of the solder mask. This type of solder mask is referred to as an NSMD (non-solder mask defined).

Therefore, the wire bonder checks the fiducial mark first, determines if the substrate is correctly positioned and how much the coordinates should be modified, if any, and performs wire bonding.

However, such an NSMD type of substrate has a problem in that, considering the tolerance of the placement of the solder mask, the bond fingers, the power ring, the ground ring, and the fiducial mark should always be spaced more than a predetermined distance from each other. This makes it difficult to make the substrate in a compact size.

SUMMARY

The present invention includes a substrate used to make, and ultimately included in, a semiconductor package, a substrate sheet including an array of interconnected substrates used for making a plurality of semiconductor packages, a method of detecting a solder mask shift on the substrate, and a method of wirebonding a semiconductor die to the substrate that compensates for solder mask shift, among other aspects.

In an exemplary embodiment, such a substrate includes an insulative core layer, a die attachment region formed on the core layer; a plurality of electrically conductive structures, e.g., electrically conductive patterns including bond fingers, a power ring, and a ground ring, formed on the core layer outward of the die attachment region; a solder mask coated on the core layer, and the entire outer peripheral edge of the electrically conductive patterns while exposing certain regions of the electrically conductive patterns, and one or more reference marks formed on the core layer outward of the die attachment region in such a manner that a shift state of the solder mask can be checked during a wire bonding process so that, in the connection of wire bonds to the electrically conductive patterns, the shift state of the solder mask can be compensated by adjusting the point of connection of a wire bond to the electrically conductive patterns. The reference mark may include one or more reference patterns formed on the insulative layer, typically of the same material (e.g., metal such as copper) as the electrically conductive patterns, and a corresponding number of openings in the solder mask, which expose a portion of the reference pattern(s).

Another exemplary embodiment of the invention is a wire bonding method that includes steps of: providing a substrate which include one or more reference marks, e.g., a plurality of reference marks each different from each other, as mentioned above; imaging the reference mark(s) of the substrate using an imaging device, such as a camera; calculating a solder mask shift using the reference marks; if there is solder mask shift, calculating a new wire bonding coordinate in consideration of the solder mask shift by, e.g., adding an amount of solder mask shift in one or both of the X and Y direction to a design wire bonding coordinate; and performing wire bonding between a semiconductor die and electrically conductive circuit patterns of the substrate, or between electrically conductive circuit patterns of the substrate, according to either the design wire bonding coordinate if there is no solder mask shift, or to the new wire bonding coordinate if there is solder mask shift.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE EXEMPLARY EMBODIMENTS

Referring to FIGS. 1A–1D, a substrate 100 for semiconductor package according to the present invention comprises: an insulative layer 110, which in this example is a resin layer 110, but could be ceramic or polyimide or the like; a die attachment region 120 formed on the resin layer 110; a plurality of electrically conductive patterns 140 formed outward of the peripheral edge of the die attachment region 120; a solder mask 150 coated on the entire outer peripheral edge of the electrically conductive patterns 140 while exposing certain regions thereof; and at least one reference mark 160 formed on the outer peripheral edge of the die attachment region 120 in such a manner that a shift state of the solder mask 150 can be checked during a wire bonding process or as part of some other process during the fabrication of the substrate or the semiconductor package. Of course, the reference mark 160 may also used to check whether the substrate 100 is loaded in a correct position or not for such processes.

Figure 1A:
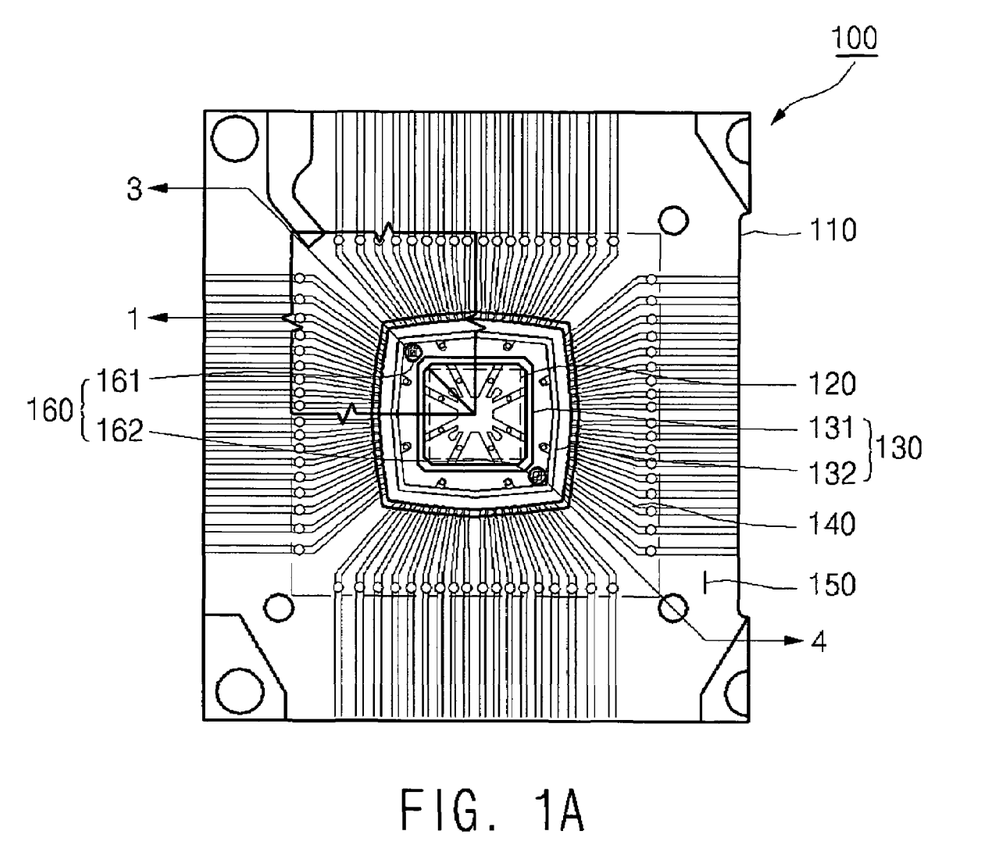
FIG. 1A is a top view showing a substrate for a semiconductor package according to an embodiment of the present invention.
Figure 1B:
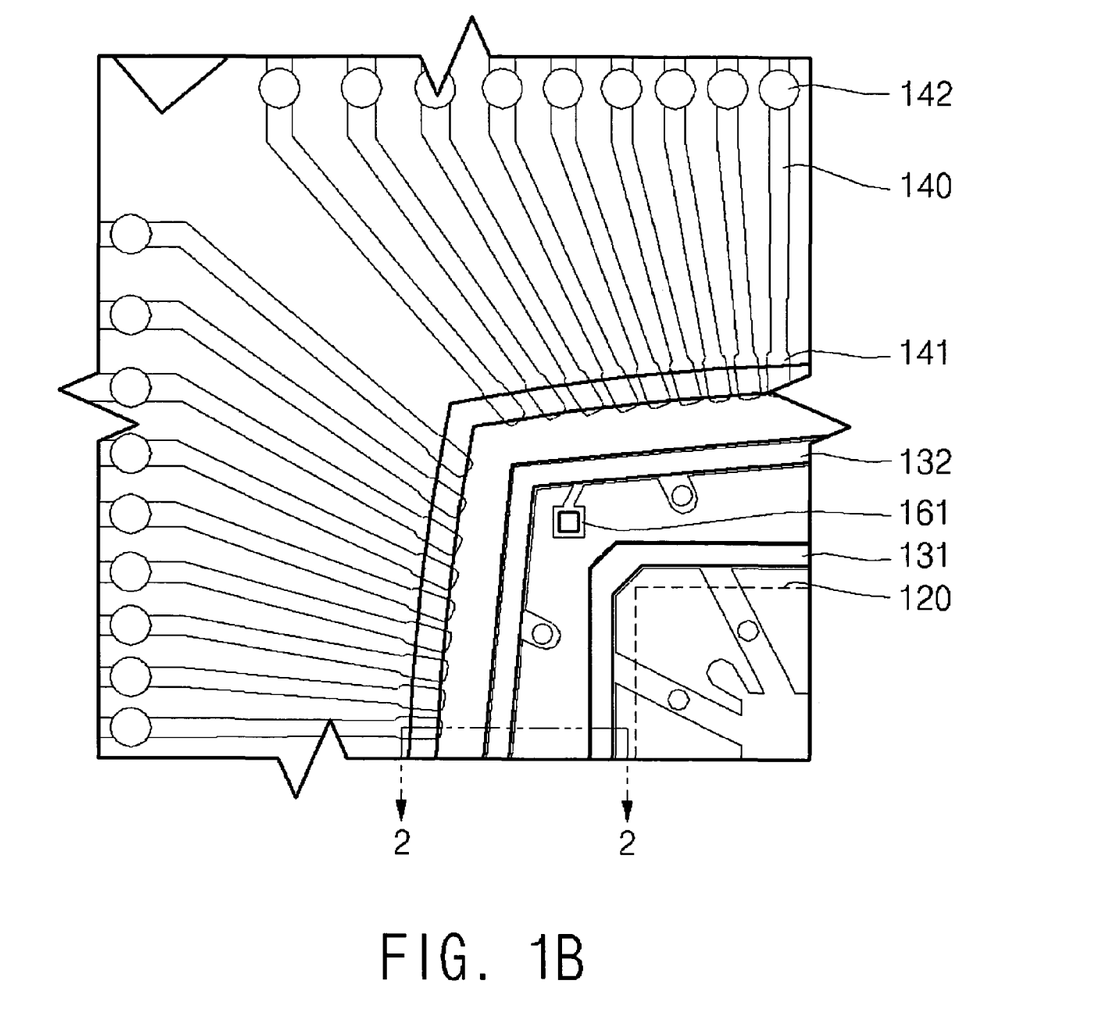
FIG. 1B is a top view magnifying area 1 of FIG. 1A.
Figure 1C:
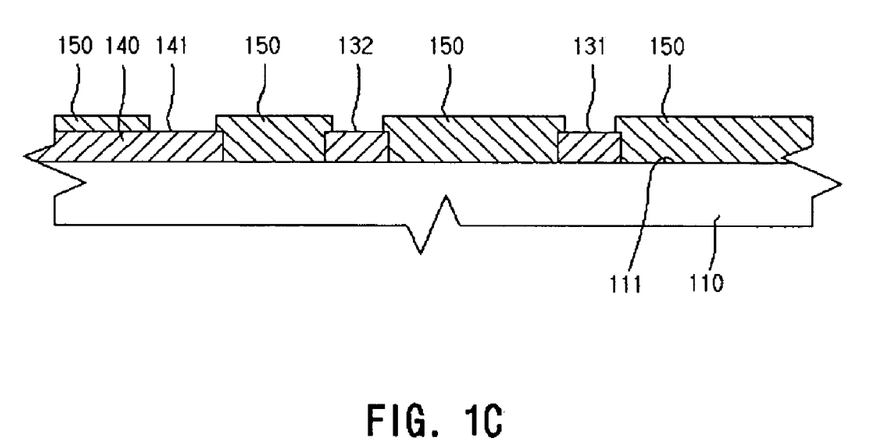
FIG. 1C is a sectional view taken along line 2—2 of FIG. 1B.

The resin layer 110 has an approximately planar upper surface 111 and is configured as a square plate with a predetermined thickness. The resin layer 110 may be composed of a conventional thermosetting resin layer or its equivalents but its material is not limited in the present invention.

Figure 1D:
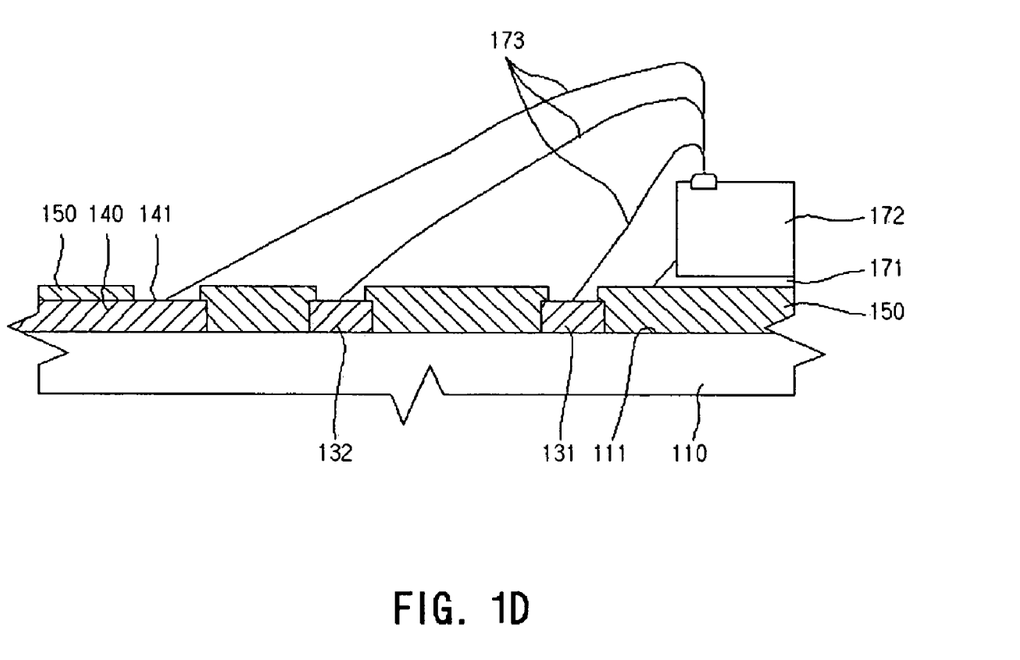
FIG. 1D is a sectional view showing a state wherein a semiconductor die has been attached to the substrate of FIG. 1A and subjected to wire bonding.

The die attachment region 120 is positioned in the center of the upper surface 111 of the resin layer 110 and has an approximately square shape. In the drawing, the die attachment region 120 is indicated by a broken line in a square shape. The die attachment region 120 may include a die pad formed of the same material as the electrically conductive patterns 140 and conductive rings 130. A semiconductor die 172 is attached on the die attachment region 120 using adhesive 171, such as an adhesive film/tape and epoxy, prior to a wire bonding process.

Meanwhile, at least one conductive ring 130 may be additionally formed outward of the outer peripheral edge of the die attachment region 120, and may be to be exposed to outside through an opening in the solder mask 150. Of course, the conductive ring may be omitted according to the configuration of the substrate.

A plurality of conductive rings 130 may be formed on a surface of the resin layer 110 outward of the outer peripheral edge of the die attachment region 120. For example, the conductive rings 130 may include a ground ring 131 and a power ring 132. In the drawing, one ground ring 131 is formed immediately outward of the outer peripheral edge of the die attachment region 120 and one power ring 132 is formed outward of the outer peripheral edge of the ground ring 131. However, the shape, number, and position of the ground ring 131 and the power ring 132 do not limit the present invention.

The electrically conductive patterns 140 are arranged on a surface of the resin layer 110 outward of the die attachment region 120, and each include one of a plurality of bond fingers 141 at the inner end thereof. The bond fingers 141 are formed adjacently to the die attachment region 120 so that electrically conductive wires can be bonded through the shortest distance. In addition, the electrically conductive patterns 140 are provided with electrically conductive via holes 142 so that they can be connected with electrically conductive patterns (not shown), which are formed on a lower surface of the resin layer 110.

The solder mask 150 exposes predetermined regions of the conductive rings 130 and the bond fingers 141 and is formed as a coating on the entire outer peripheral edge of the conductive rings 130 and bond fingers 141 with a predetermined thickness. As such, the substrate 100 is of a SMD (solder mask defined) type. The solder mask 150 covers portions of the surface of the resin layer 110 between the electrically conductive patterns 140 and the conductive rings 130, and may cover the die attachment region. The solder mask is an insulative material, and typically will be epoxy-based.

One or more (e.g., 1 to 5) reference mark(s) 160 is (are) formed on the outer peripheral edge of the die attachment region 120 so that the shift state of the solder mask 150 can be checked easily during a wire bonding process or some other assembly process. In the drawing, the reference mark 160 is shown to be formed with a plurality of different shapes, and positioned outward of the die attachment region 120 between the ground ring 131 and the power ring 132 along a diagonal through opposed corners of the die attachment region 120. However, the shape, number, and position of the reference mark 160 do not limit the present invention. For example, although the reference marks 160 are shown to be connected to the power ring 132 in the drawing, they may be connected to the ground ring 131 or to certain electrically conductive patterns 140, or they may be self-contained and connected to nothing. Furthermore, although two reference marks 160 are shown in the drawing with different shapes, they may have the same shape.

In FIG. 1D, numeral 173 refers to electrically conductive wires, which electrically connect the semiconductor die 172 with the ground ring 131, the power ring 132, and the bond fingers 141 of the electrically conductive patterns 140, respectively.

As mentioned above, although not shown in the drawing, a number of electrically conductive patterns may be formed on the lower surface of the resin layer 110 and may be connected with the electrically conductive patterns 140, which are formed on the upper surface 111 of the resin layer 110, by means of the electrically conductive via holes 142 extending vertically through the resin layer 110.

Figure 2A:
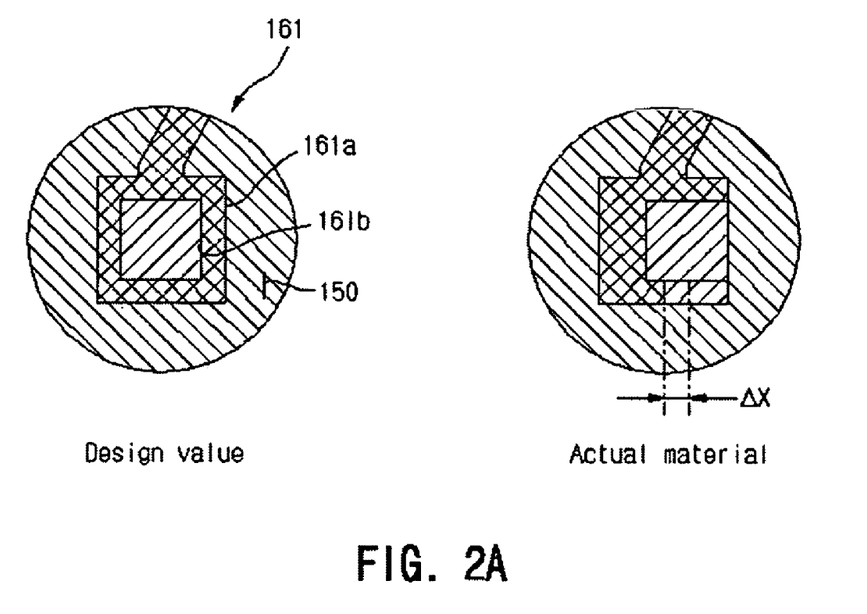
FIG. 2A is a top view magnifying area 3 of FIG. 1A and showing an example of a design value and an actual material.
Figure 2B:
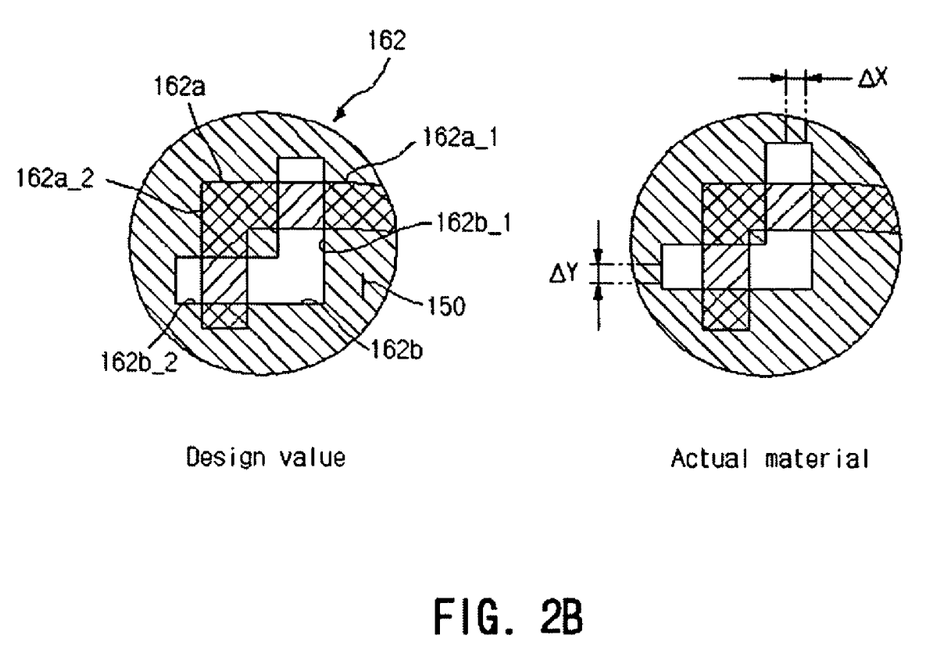
FIG. 2B is a top view magnifying area 4 of FIG. 1A and showing an example of a design value and an actual material.

Referring to FIG. 2A, there is shown a top view magnifying area 3 of FIG. 1A and showing an example of a design value and an actual material and, referring to FIG. 2B, there is shown a top view magnifying area 4 of FIG. 1A and showing an example of a design value and an actual material.

As shown, a reference mark 161 may be composed of a reference pattern 161a and an overlying solder mask opening 161b, which may be entirely within the area of the reference pattern 161a, or partly within the area of the reference pattern 161a and partly over a surface of a resin layer 110 outward of the reference pattern 161a.

The conductive rings 130, the electrically conductive patterns 140, and the reference patterns may be composed of metal, such as copper (Cu), copper alloy, gold (Au), silver (Ag), or equivalents thereof. However, their composition is not limited in the present invention.

As shown in FIG. 2A, the reference pattern 161a of the reference mark 161 may have a substantially square shape when viewed from above. The solder mask opening 161b may also have a substantially square shape when viewed from above. The solder mask opening 161b is smaller in area than the reference pattern 161a, and accordingly exposes only a subportion of the underlying reference pattern 161a. In the drawing, the design value (i.e., the design intended for the substrate) of the reference mark 161 has the solder mask opening 161b formed at the very center of the reference pattern 161a. This state assumes that no shift has occurred to the solder mask 150. Of course, in the actual material, the solder mask 150 may shift laterally on the substrate, for example, a distance as indicated by ΔX in the drawing.

In addition, as shown in FIG. 2B, a reference pattern 162a of another reference mark 162 may be composed of a first region 162a_1 and a second region 162a_2, which each have a rectangular shape when viewed from above and are connected at a substantially right angle. In addition, a solder mask opening 162b may be composed of a first region 162b_1 and a second region 162b_2, which each have a rectangular shape when viewed from above and are connected at a substantially right angle. Furthermore, the first regions 162a_1, 162b_1 of the reference pattern 162a and the solder mask opening 162b may cross each other perpendicularly and the second regions 162a_2, 162b_2 of the reference pattern 162a and the solder mask opening 162b may also cross each other perpendicularly. In the design value of the drawing, the first and second regions 162b_1, 162b_2 of the solder mask opening 162b cross each other in an approximate center of the first and second regions 162a_1, 162a_2 of the reference pattern 162a. Two subportions only of the first and second regions 162a_1, 162a_2 of the reference pattern 162a are exposed through the first and second regions 162b_1, 162b_2 of the solder mask opening 162b. This corresponds to a state wherein no shift has occurred to the solder mask 150. Of course, in the actual material, the solder mask 150 may shift, for example, a distance as indicated by ΔX and ΔY in the drawing.

Figure 3A:
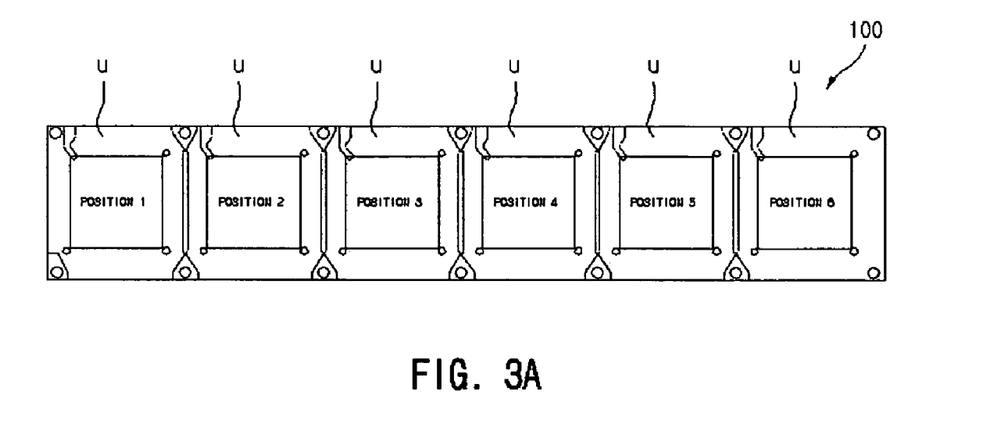
FIG. 3A is a top view showing a substrate sheet for making a plurality of semiconductor packages.
Figure 3B:
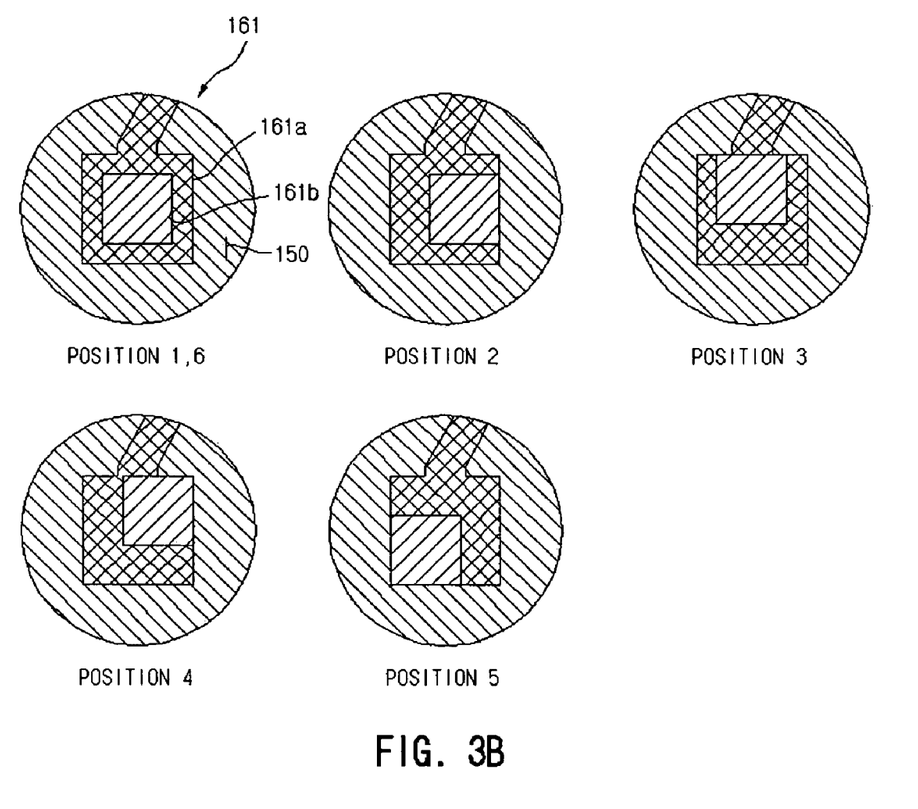
FIG. 3B is a top view showing each state of solder mask shift according to its position in FIG. 3A.
Figure 3C:
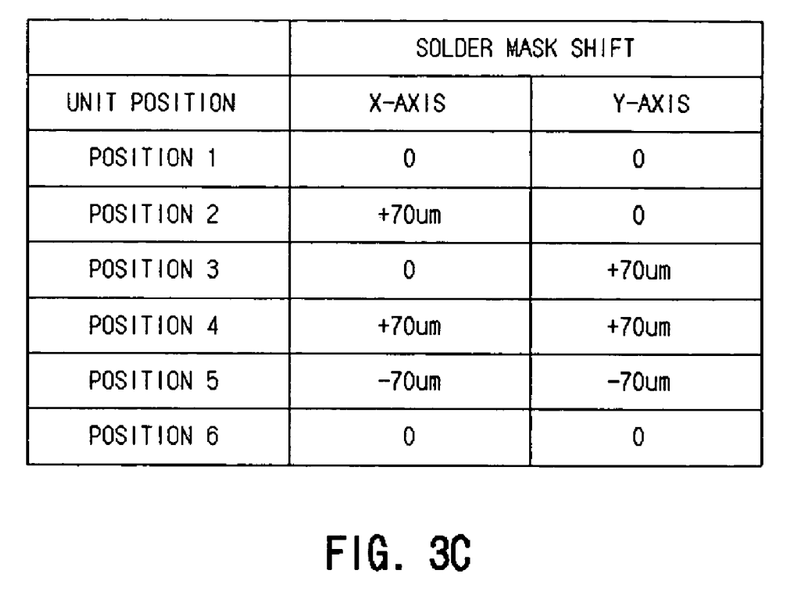
FIG. 3C is a table showing each state of a solder mask opening, which is shifted from a reference pattern, according to its position in FIG. 3B.

As shown in FIGS. 3A–3C, substrate 100 for a semiconductor package may originate in a substrate sheet including a plurality of interconnected units u, which are connected substantially in a single row, or in rows and columns, for maximum productivity.

Meanwhile, as shown in FIG. 3B, the solder mask 150 or the solder mask opening 161b may shift a distance in the X and Y axis directions according to the position of each unit u. Such a shift phenomenon of the solder mask 150 often results from a positional tolerance of the substrate 100 or from a tolerance of coating equipment, during a coating process of the solder mask 150.

More specifically, the positional interrelationship between the reference mark 161, particularly the reference pattern 161a and the solder mask opening 161b, due to the shift of the solder mask 150, will now be described with simultaneous reference to FIG. 3C.

In position 1, 6, the solder mask opening 161b is formed at the very center of the square reference pattern 161a within the reference mark 161, as in the case of a design value. Accordingly, the position 1, 6 corresponds to a state wherein no solder mask shift has occurred in the X or Y axis direction.

On the other hand, in position 2, the solder mask opening 161b is positioned at the right-hand side of the square reference pattern 161a in the reference mark 161, contrary to the design value. This corresponds to a state wherein, for example, +70 um of solder mask shift has occurred in the X axis direction but none has occurred in the Y axis direction.

In position 3, the solder mask opening 161b is positioned at the upper side of the square reference pattern 161a in the reference mark 161, which is also contrary to the design value. This corresponds to a state wherein, for example, no solder mask shift has occurred in the X axis direction but +70 um of solder mask shift has occurred in the Y axis direction.

In position 4, the solder mask opening 161b is positioned at the upper and right-hand side of the square reference pattern 161a in the reference mark 161, which is also contrary to the design value. This corresponds to a state wherein, for example, +70 um of solder mask shift has occurred in the X axis direction and +70 um of solder mask shift has occurred in the Y axis direction.

In position 5, the solder mask opening 161b is positioned at the lower and left-hand side of the square reference pattern 161a in the reference mark 161, which is also contrary to the design value. This corresponds to a state wherein, for example, −70 um of solder mask shift has occurred in the X axis direction and −70 um of solder mask shift has occurred in the Y axis direction.

Figure 4:
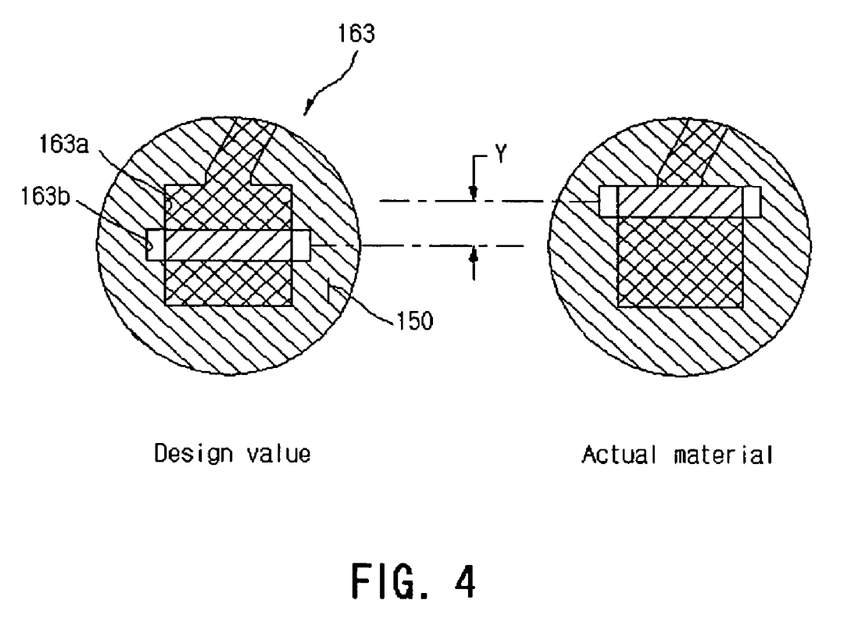
FIG. 4 is a top view showing an example of a design value and an actual material of a reference mark according to another embodiment of the present invention.

Referring to FIG. 4, there is shown an example of a design value and an actual material of a reference mark 163 according to another embodiment of the present invention.

As shown, the reference mark 163 according to the present invention may be composed of a reference pattern 163a, which has a substantially square shape when viewed from above, and a solder mask opening 163b, which has a substantially oblong rectangular shape extending horizontally when viewed from above, and exposes a subportion only of the reference pattern 163a. The long side dimension of the solder mask opening 163b is greater in length than a side of the substantially square reference pattern 163a, and the short side dimension of the solder mask opening 163b is lesser in length than a side of the reference pattern 163a.

Although the solder mask opening 163b is designed and positioned at the very center of the reference pattern 163a horizontally in the design value, a solder mask shift may occur in the Y axis direction after a solder mask 150 is actually coated, in other words, in the actual material and this state can be checked easily. Of course, such a reference mark 163 may also used to check and calculate a solder mask shift in the X axis direction.

Figure 5:
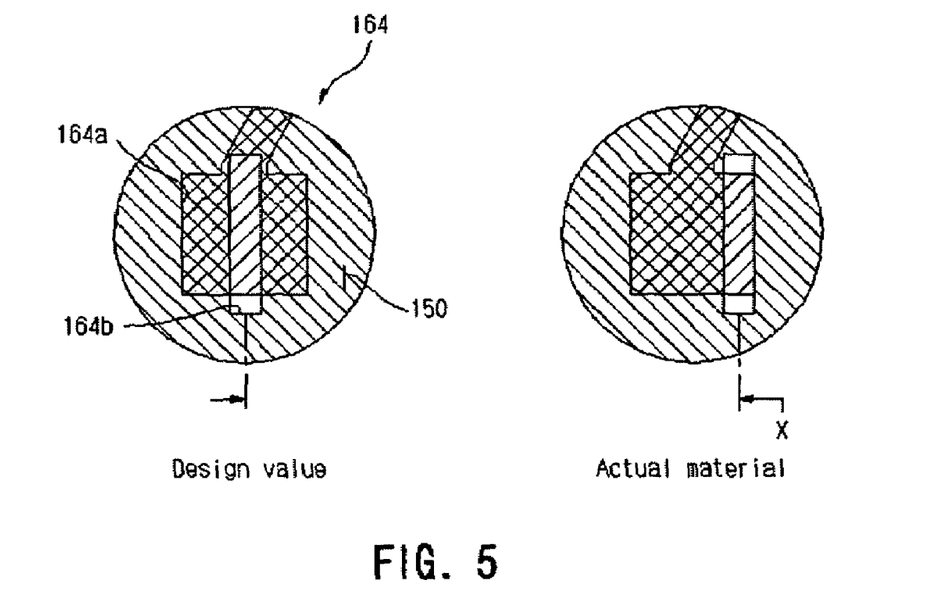
FIG. 5 is a top view showing an example of a design value and an actual material of a reference mark according to another embodiment of the present invention.

Referring to FIG. 5, there is shown an example of a design value and an actual material of a reference mark 164 according to another embodiment of the present invention.

As shown, the reference mark 164 according to the present invention may be composed of a reference pattern 164a, which has a substantially square shape when viewed from above, and a solder mask opening 164b, which has a substantially oblong rectangular shape extending vertically when viewed from above, and exposes a subportion only of the reference pattern 164a. The long side dimension of the solder mask opening 164b is greater in length than a side of the substantially square reference pattern 164a, and the short side dimension of the solder mask opening 164b is lesser in length than a side of the reference pattern 164a.

Although the solder mask opening 164b is designed and positioned at the very center of the reference pattern 164a vertically in the design value, a solder mask shift may occur in the X axis direction and this state can be checked easily in the actual material, that is, after a solder mask 150 is actually coated. Of course, such a reference mark 164 may also used to check and calculate a solder mask shift in the Y axis direction.

Figure 6:
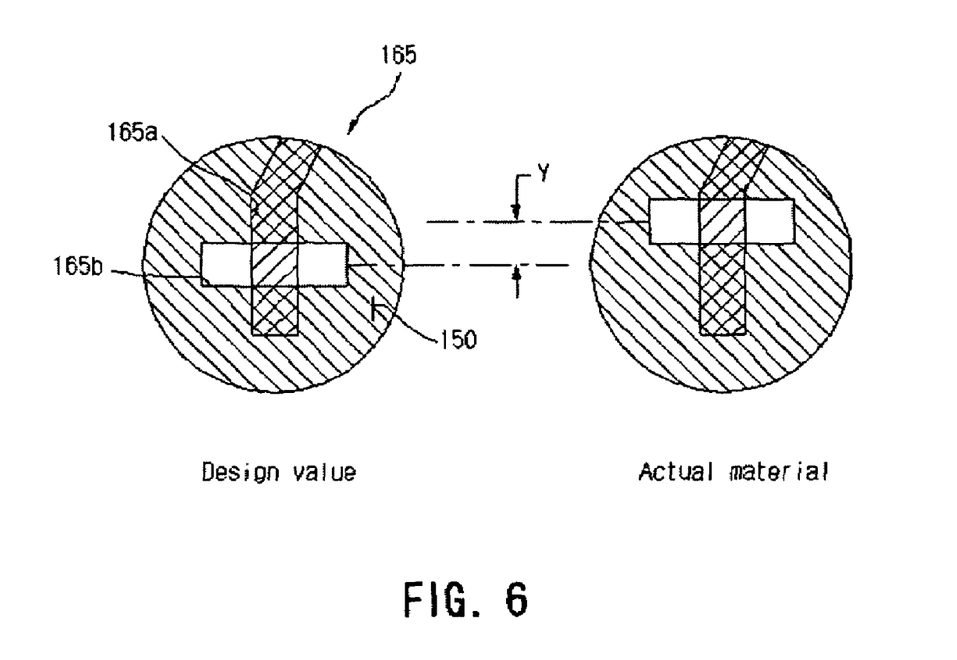
FIG. 6 is a top view showing an example of a design value and an actual material of a reference mark according to another embodiment of the present invention.

Referring to FIG. 6, there is shown an example of a design value and an actual material of a reference mark 165 according to another embodiment of the present invention.

As shown, the reference mark 165 according to the present invention may be composed of a reference pattern 165a, which has a substantially oblong rectangular shape when viewed from above, and a solder mask opening 165b, which also has a substantially oblong rectangular shape when viewed from above and exposes a subportion only of the reference pattern 165a. The reference pattern 165a and the solder mask opening 165b may cross each other perpendicularly, and may be the same size.

Although the solder mask opening 165b is designed and positioned at the very center of the reference pattern 165a horizontally in the design value, a solder mask shift may occur in the Y axis direction after a solder mask 150 is actually coated, in other words, in the actual material and this state can be checked easily. Of course, such a reference mark 165 may also used to check and calculate a solder mask shift in the X axis direction.

Figure 7:
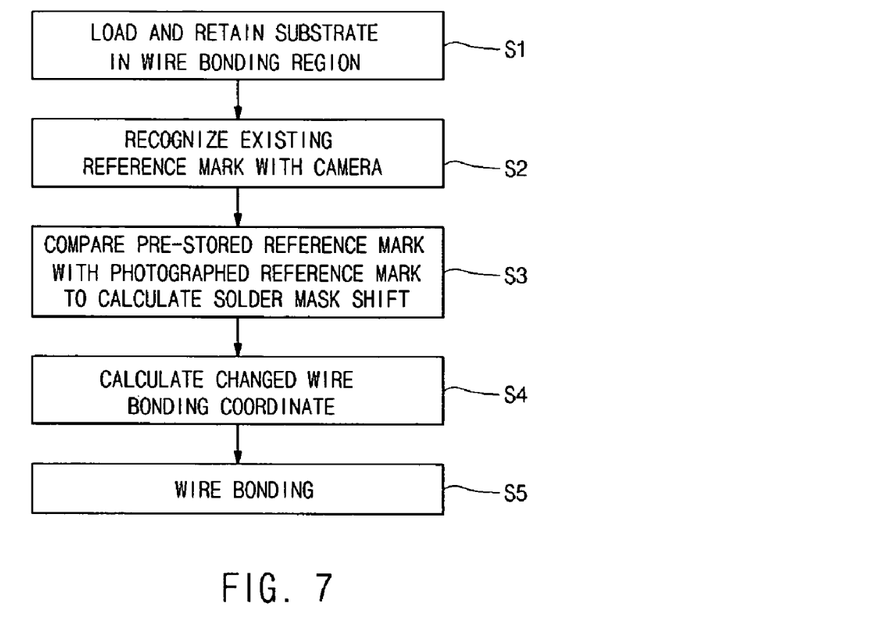
FIG. 7 is a flow chart showing a wire bonding method according to an embodiment of the present invention.

Referring to FIG. 7, there is shown a flow chart showing a wire bonding method according to an embodiment of the present invention and, referring to FIG. 8A to FIG. 8E, there are shown each state according to each step of FIG. 7, respectively.

As shown, a wire bonding method according to the present invention comprises: a step S1 of loading a substrate which include various types of reference marks, as mentioned above; a step S2 of imaging, e.g., photographing the reference marks of the substrate using, e.g., a camera, during wire bonding; a step S3 of calculating a solder mask shift using the reference marks; a step S4 of calculating a newly changed wire bonding coordinate in consideration of the solder mask shift; and a step S5 of performing actual wire bonding.

Figure 8A:
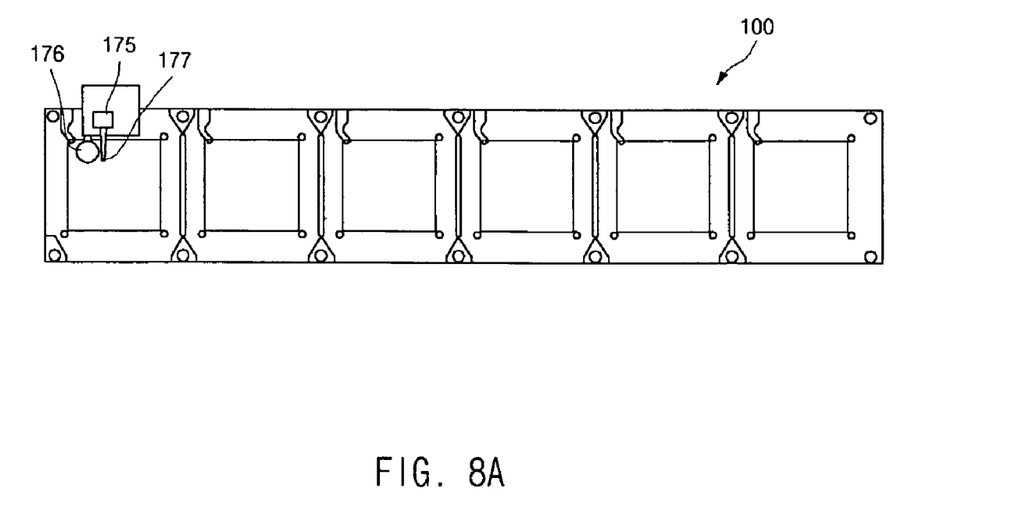
FIG. 8A to FIG. 8E are top views showing each state according to each step of FIG. 7, respectively.

Firstly, in the step S1 of loading a substrate, a substrate 100, which may be an individual unit or part of a substrate sheet, and which has at least one reference mark 160 of any of the above-mentioned shapes, is loaded in a wire bonding region (see FIG. 8A). In the drawing, numerals 175, 176, and 177 refer to a wire bonder, a camera, and a capillary, respectively.

Figure 8B:
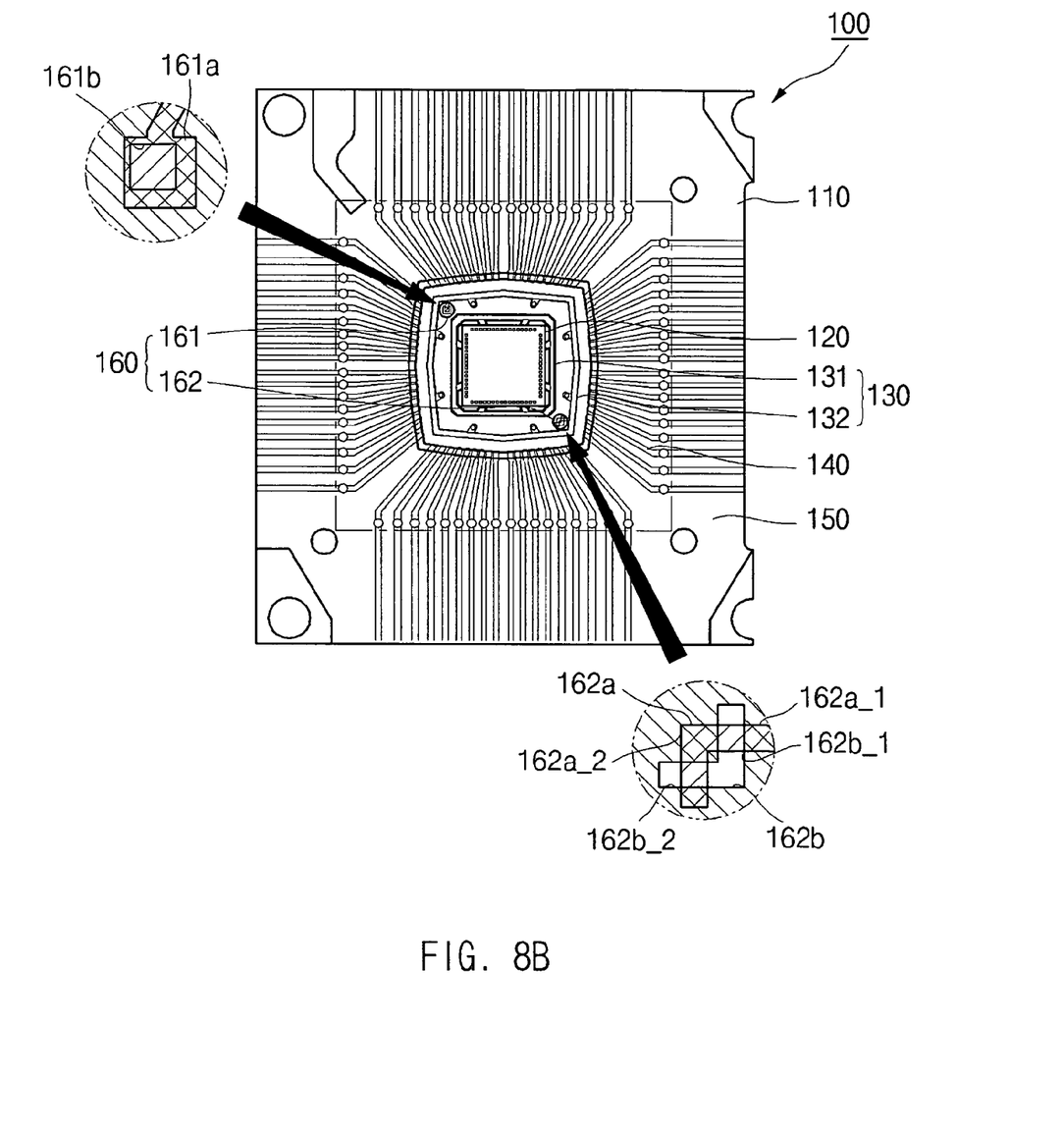
Figure 8C:
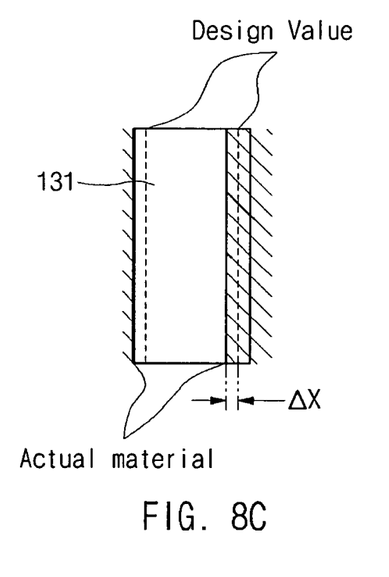

Subsequently, in the step S2 of photographing the reference marks, at least one reference mark 161, 162, which is composed of reference patterns 161a, 162a and solder mask openings 161b, 162b, is photographed by a camera 176, which is mounted on a wire bonder 175 (see FIG. 8B).

The drawing shows a state wherein reference marks 161, 162, which are positioned diagonally across from one another, and are formed outward of an outer peripheral edge of a die attachment region 120, are photographed.

An upper reference mark 161 has a reference pattern 161a, which has a substantially square shape when viewed from above, and an overlying solder mask opening 161b, which also has a substantially square shape when viewed from above but is of lesser area than reference pattern 161a. The solder mask opening 161b is within, but displaced toward the upper and left-hand side of the reference pattern 161a. In other words, the solder mask 150 has shifted a distance upward and leftward, respectively, in comparison to a design value as shown in FIG. 2A.

A lower reference mark 162 of the substrate 100 diagonally opposed to the reference mark 161 has a reference pattern 162a which is composed of a first region 162a_1 and a second region 162b_2, which have a rectangular shape when viewed from above and are connected at a substantially right angle. The solder mask opening 162b is composed of a first region 162b_1 and a second region 162b_2, which have a rectangular shape when viewed from above and are connected at a substantially right angle. The first regions 162a_1, 162b_1 of the reference pattern 162a and the solder mask opening 162b cross each other perpendicularly, as well as the second regions 162a_2, 162b_2 of the reference pattern 162a and the solder mask opening 162a cross each other perpendicularly. The solder mask opening 162b is displaced toward upper and left-hand side of within the reference pattern 162a. In other words, the solder mask 150 has shifted a distance upward and leftward, respectively, in comparison to a design value as shown in FIG. 2B.

The reason to differentiate the configuration of the reference marks 161, 162, which are photographed by the camera, is that the state of solder mask shift should be checked more accurately and it should be checked whether the substrate 100 has been loaded with correct direction. If the reference marks 161, 162 have the same configuration, it may be difficult to check if the substrate 100 has been loaded in the opposite direction.

In the step S3 of calculating a solder mask shift, a solder mask shift is calculated using the reference marks 161, 162, which are photographed by the camera 176. In other words, images of a pre-stored reference pattern and the solder mask opening are compared with images of the photographed reference pattern and the solder mask opening to calculate the degree of solder mask shift, which has occurred actually (see FIG. 8C). In the drawing, the solder mask 150 is shown to have shifted as much as ΔX in the ground ring 131. The solder mask also has shifted in the Y axis direction (not shown in the drawing).

Figure 8D:
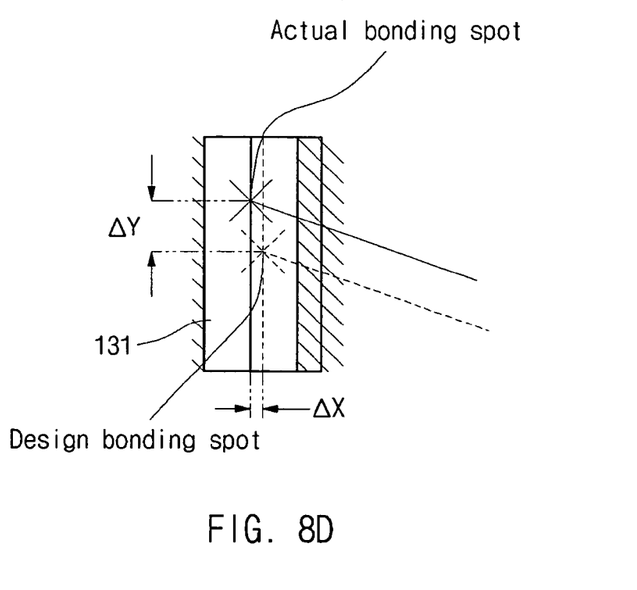

In the step S4 of calculating a changed wire bonding coordinate, a newly changed wire bonding coordinate is calculated in consideration of the calculated solder mask shift. As a result of the calculation, the newly changed wire bonding coordinate is formed on the ground ring 131, which is the very center between the solder mask 150. Accordingly, wire bonding is prevented from being formed on a surface of the solder mask 150 (FIG. 8D).

Figure 8E:
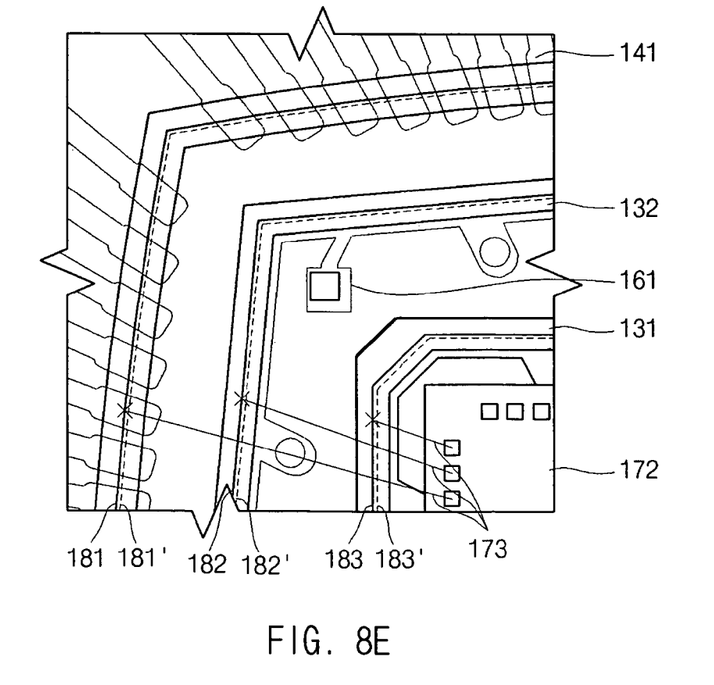

Finally, in the wire bonding step S5, wire bonding is performed according the changed wire bonding coordinate, which has been calculated. Specifically, a semiconductor die 172 is bonded with, for example, a ground ring 131, a power ring 132, or a bond finger 141 using an electrically conductive wire 173 (FIG. 8E). Numerals 181', 182', 183' refer to design bonding lines and 181,182,183 refer to actual bonding lines.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

The invention claimed is:

1. A substrate for a semiconductor package comprising:
   an insulative layer having an approximately planar surface and a predetermined thickness;

a die attachment region formed on the surface of the insulative layer;

a plurality of electrically conductive patterns which are positioned on the surface of the insulative layer outward of the die attachment region, wherein each of the electrically conductive patterns includes a respective one of a plurality of bond fingers;

a solder mask on the surface of the substrate, wherein the solder mask includes a plurality of openings, and an internal area of each of the bond fingers is individually exposed through a respective one of the openings; and at least one reference mark formed on the surface of the insulative layer outward of the die attachment region that allows for a state of a solder mask shift to be checked, the at least one reference mark comprising a reference pattern overlaid by one of the openings of the solder mask through which a subportion only of the reference pattern is exposed, the position of the respective opening relative to the underlying reference pattern determining the solder mask shift, wherein the reference pattern of the at least one reference mark is composed of a first region and a second region, which have a substantially oblong rectangular shape in a plan view and are connected at a substantially right angle; the solder mask opening of the at least one reference mark is also composed of a first region and a second region, which have a substantially oblong rectangular shape in a plan view and are connected at a substantially right angle; the first regions of the reference pattern and the solder mask opening cross each other perpendicularly near centers of the first regions of the reference pattern and the solder mask opening; and the second regions of the reference pattern and the solder mask opening also cross each other perpendicularly near centers of the second regions of the reference pattern and the solder mask opening.

2. The substrate as claimed in claim 1, wherein at least one conductive ring is additionally formed on the surface of the insulative layer between the die attachment region and the bond fingers, wherein a portion of the conductive ring is to be exposed to an outside via an opening through the solder mask.

3. The substrate as claimed in claim 2, wherein the at least one conductive ring includes a ground ring and a power ring.

4. The substrate as claimed in claim 1, wherein the at least one reference mark is a plurality of reference marks, each having a different shape.

5. The substrate as claimed in claim 1, wherein a pair of the reference marks are diagonally opposed from one another, the reference marks of the pair having different shapes.

6. The substrate as claimed in claim 1, wherein a reference pattern and a solder mask opening of another reference mark of the at least one reference mark each have a substantially square shape in a plan view.

7. The substrate as claimed in claim 1, wherein a reference pattern of another reference mark of the at least one reference mark has a substantially square shape in a plan view and a solder mask opening of the another reference mark of the at least one reference mark has a substantially oblong rectangular shape in a plan view.

8. The substrate as claimed in claim 7, wherein the long side of the solder mask opening of the another reference mark is greater in length than a side of the reference pattern of the another reference mark, and the short side of the solder mask opening of the another reference mark is lesser in length than the side of the reference pattern of the another reference mark.

9. The substrate as claimed in claim 1, wherein a reference pattern of another reference mark of the at least one reference mark has a substantially oblong rectangular shape in a plan view, a solder mask opening of the another reference mark of the at least one reference mark also has a substantially oblong rectangular shape in a plan view, and the reference pattern of the another reference mark and the solder mask opening of the another reference mark cross each other perpendicularly.

10. A substrate for a semiconductor package comprising:
an insulative layer;
a solder mask on a surface of the insulative layer, wherein the solder mask includes a plurality of openings;
a die attachment region formed on the surface of the insulative layer;
a first conductive ring formed on the surface of the insulative layer outward of the die attachment region, wherein a portion of the first conductive ring is exposed through a respective one of the openings;
a second conductive ring formed on the surface of the insulative layer outward of the first conductive ring, wherein a portion of the second conductive ring is exposed through a respective one of the openings;
a plurality of electrically conductive patterns formed on the surface of the insulative layer outward of the second conductive ring, wherein each of the electrically conductive patterns includes a respective one of a plurality of bond fingers and an internal area of each of the bond fingers is individually exposed through a respective one of the openings; and
a first reference mark formed on the surface of the insulative layer between the first conductive ring and the second conductive ring, the first reference mark comprising:
one of the openings of the solder mask comprising a first region and a second region, which have a substantially oblong rectangular shape in a plan view and are connected at a substantially right angle; and
a reference pattern comprising a first region and a second region, which have a substantially oblong rectangular shape in a plan view and are connected at a substantially right angle,
wherein the first regions of the reference pattern and the solder mask opening cross each other perpendicularly; and
wherein the second regions of the reference pattern and the solder mask opening also cross each other perpendicularly.

11. The substrate as claimed in claim 10, wherein the first conductive ring comprises a ground ring.

12. The substrate as claimed in claim 10, wherein the second conductive ring comprises a ground ring.

13. The substrate as claimed in claim 10, wherein the first conductive ring comprises a power ring.

14. The substrate as claimed in claim 10, wherein the second conductive ring comprises a power ring.

15. The substrate as claimed in claim 10, further comprising a second reference mark diagonally opposed from the first reference mark.

16. The substrate as claimed in claim 15, wherein the first reference mark has a different shape than the second reference mark.

17. The substrate as claimed in claim 15, wherein a reference pattern and a solder mask opening of the second reference mark each have a substantially square shape in a plan view.

18. The substrate as claimed in claim 15, wherein a reference pattern of the second reference mark comprises a first region and a second region, which have a substantially oblong rectangular shape in a plan view and are connected at a substantially right angle; a solder mask opening of the second reference mark is also composed of a first region and a second region, which have a substantially oblong rectangular shape in a plan view and are connected at a substantially right angle; the first regions of the reference pattern of the second reference mark and the solder mask opening of the second reference mark cross each other perpendicularly; and the second regions of the reference pattern of the second reference mark and the solder mask opening of the second reference mark also cross each other perpendicularly.

19. The substrate as claimed in claim 15, wherein a reference pattern of the second reference mark has a substantially square shape in a plan view and a solder mask opening of the second reference mark has a substantially oblong rectangular shape in a plan view.

20. The substrate as claimed in claim 19, wherein the long side of the solder mask opening of the second reference mark is greater in length than a side of the reference pattern of the second reference mark, and the short side of the solder mask opening of the second reference mark is lesser in length than the side of the reference pattern of the second reference mark.

21. The substrate as claimed in claim 15, wherein a reference pattern of the second reference mark has a substantially oblong rectangular shape in a plan view, a solder mask opening of the second reference mark also has a substantially oblong rectangular shape in a plan view, and the reference pattern of the second reference mark and the solder mask opening of the second reference mark cross each other perpendicularly.

22. A substrate for a semiconductor package comprising:
an insulative layer;
a solder mask on a surface of the insulative layer, wherein the solder mask includes a plurality of openings;
a die attachment region formed on the surface of the insulative layer;
a first conductive ring formed on the surface of the insulative layer outward of the die attachment region, wherein a portion of, the first conductive ring is exposed through a respective one of the openings;
a second conductive ring formed on the surface of the insulative layer outward of the first conductive ring, wherein a portion of the second conductive ring is exposed through a respective one of the openings;
a plurality of electrically conductive patterns formed on the surface of the insulative layer outward of the second conductive ring, wherein each of the electrically conductive patterns includes a respective one of a plurality of bond fingers and an internal area of each of the bond fingers is individually exposed through a respective one of the openings;
a first reference mark formed on the surface of the insulative layer between the first conductive ring and the second conductive ring; and
a second reference mark formed on the surface of the insulative layer between the first conductive ring and the second conductive ring, the second reference mark diagonally opposed from the first reference mark.

23. The substrate as claimed in claim 22 wherein the first reference mark comprises:
one of the openings of the solder mask comprising a first region and a second region, which have a substantially oblong rectangular shape in a plan view and are connected at a substantially right angle; and
a reference pattern comprising a first region and a second region, which have a substantially oblong rectangular shape in a plan view and are connected at a substantially right angle,
wherein the first regions of the reference pattern and the solder mask opening cross each other perpendicularly; and
wherein the second regions of the reference pattern and the solder mask opening also cross each other perpendicularly.

* * * * *